United States Patent [19]
Dieterich

[11] Patent Number: 5,208,596
[45] Date of Patent: May 4, 1993

[54] DAC DISTORTION COMPENSATION
[75] Inventor: Charles B. Dieterich, Kingston, N.J.
[73] Assignee: RCA Thomson Licensing Corporation, Princeton, N.J.
[21] Appl. No.: 866,711
[22] Filed: Apr. 10, 1992
[51] Int. Cl.$^5$ .............................................. H03M 1/66
[52] U.S. Cl. .................... 341/144; 364/724.1
[58] Field of Search ........................ 341/144, 118; 364/724.1, 724.2

[56] References Cited
U.S. PATENT DOCUMENTS

| | | | |
|---|---|---|---|
| 4,506,288 | 3/1985 | Lewis, Jr. ........................ | 358/21 |
| 4,591,832 | 5/1986 | Fling et al. ..................... | 340/347 |
| 4,771,334 | 9/1988 | Bolger ............................ | 358/242 |
| 4,782,324 | 11/1988 | Underwood ...................... | 341/147 |
| 4,864,403 | 9/1989 | Chao et al. ..................... | 358/167 |
| 4,897,725 | 1/1990 | Tanaka et al. .................. | 358/167 |
| 4,926,179 | 5/1990 | Yoshioka ........................ | 341/144 |
| 4,937,576 | 6/1990 | Yoshio et al. .................. | 341/131 |
| 4,977,403 | 12/1990 | Larson .......................... | 341/143 |
| 5,138,601 | 8/1992 | Shimizume ...................... | 369/59 |

Primary Examiner—Marc S. Hoff
Attorney, Agent, or Firm—Joseph S. Tripoli; Eric P. Herrmann; Ronald H. Kurdyla

[57] ABSTRACT

The present invention is directed to compensating the sin (x)/x response attendant the output signals from a Digital-To-Analog converter in systems consisting of the cascade connection of a digital processor having a non-uniform frequency response h(nT) and a Digital-To-Analog converter. This is accomplished by altering the processor to provide a frequency response of h(nT)*g(nT), where h(nT) is the impulse response of the processor, g(nT) is the impulse response of the reciprocal of the frequency response of the DAC, and the asterisk represents convolution. Alternatively, if the Fourier transform of the frequency response of the processor is given by F($\omega$), and the DAC exhibits a frequency response S($\omega$), which is the frequency transform of the time response of the DAC sample and hold type output, then the processor is substituted with one having a frequency response defined by the inverse Fourier transform IF(F($\omega$)/S($\omega$))) over the frequency band of interest.

10 Claims, 1 Drawing Sheet

DAC DISTORTION COMPENSATION

This invention relates to apparatus for compensating deleterious frequency characteristics in digital to analog converters, DAC's.

BACKGROUND OF THE INVENTION

Digital-to Analog convertors or DAC's convert pulse code modulated signals to analog form. Typically the pulse code modulated signals are generated by an analog to digital conversion process. In such cases the pulse code modulated signals (or binary samples) represent the analog signal at respective instances in time, that is each sample is an impulse with discrete amplitude. Respective samples should be represented by a flat frequency response. In conversion of the binary samples back to the analog domain, digital-to-analog converters produce analog amplitudes representative of the binary value, but with respective amplitudes having a duration of a sample period. While originally each sample corresponded to a measurement representing an instant in time, at the output of the digital-to-analog convertor, each instant is effectively expanded to a duration equal to a sample period. As a consequence of this time expansion, the frequency response of the converted analog signal is distorted by a sin $(\pi fT)/\pi fT$ frequency response characteristic. This function tends to limit the bandwidth of the processed signal, and is attendant digital-to-analog convertors of the type which produce output analog amplitude values having a duration of a sample period for each binary input value.

SUMMARY OF THE INVENTION

The present invention is directed to compensating the sin $(\pi fT)/\pi fT$ frequency response attendant the output signals from a Digital-To-Analog converter in systems consisting of the cascade connection of a digital processor having a non-uniform frequency response h(nT) and a Digital-To-Analog converter. This is accomplished by altering the processor to provide a frequency response of h(nT)*g(nT), where h(nT) is the impulse response of the processor, g(nT) is the impulse response of the reciprocal of the frequency response of the DAC, and the asterisk represents convolution. Alternatively, if the Fourier transform of the frequency response of the processor is given by $F(\omega)$, and the DAC exhibits an inherent frequency response $S(\omega)$, then the processor is substituted with one having a frequency response defined by the inverse Fourier transform, IF($F(\omega)/S(\omega)$)), over the frequency band of interest, where IF(argument) designates the inverse Fourier transform function.

DETAILED DESCRIPTION OF THE INVENTION

Figure 1:
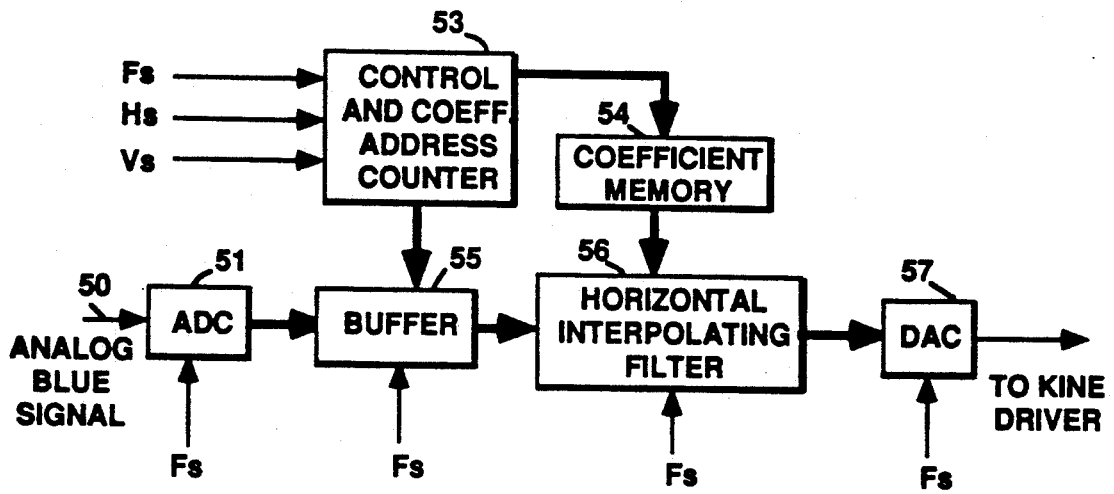
FIG. 1 is a block diagram of processing apparatus incorporating an embodiment of the invention.

A first embodiment of the invention is illustrated in FIG. 1 in the environment of raster distortion and convergence correction circuitry in a television signal display device. Both digital and analog television receivers are subject to raster and distortion errors. Horizontal convergence errors and raster distortion, such as side pincushion distortion, may be corrected by selectively delaying one or more of the individual color signals in a given scan line. This delay may be accomplished by clocking samples of the signal into a memory device at the input sample rate, and clocking the samples out of the memory with clock signals of varying phase to produce incremental sample delays. Alternatively, as described in U.S. Pat. No. 4,771,334, respective ones of the color signals may be effectively selectively delayed by interpolating successive signal samples. That is, the amplitude values of a number of successive samples are scaled and combined in such fashion to generate a sample value having an amplitude representing a pixel spatially located between respective ones of the pixels represented by actual sample values. Successive interpolated samples are respectively generated by different interpolation functions. This is accomplished simply by changing the scaling coefficients in the interpolator for successive sample value computations. Interpolators of this type are in effect programmable adaptive filters which have an impulse response $h_i(nT)$, where the index i connotes one of many impulse responses that the interpolator may be programmed to exhibit.

FIG. 1 shows, in block form, an example of convergence and distortion circuitry that may be implemented in the blue signal path of a television receiver. Similar circuitry (not shown) is incorporated in the red and green signal paths except that the respective interpolating filters in the respective paths are programmed to exhibit different signal delays. In this example separated analog blue signal is applied to an analog-to-digital converter 51 which develops digital samples representing the analog signal. The digital samples are coupled to a buffer memory 55 such as a first-in-first-out memory (FIFO). Samples in the FIFO are supplied to the horizontal interpolating filter 56 as needed by the filter 56. The interpolating filter 56 generates samples corresponding to samples exhibiting more or less delay depending on the instantaneous location of the current pixel along the horizontal scan line. That is, interpolated samples at the extremities of the line exhibit relatively large effective delays and samples near the center of the line exhibit no delay. The samples provided by the interpolating filter 56 are coupled to a DAC 57 which converts the digital samples to analog form and applies same to kinescope driver circuitry.

The interpolating filter 56 is conditioned to provide each of the successive interpolation functions $h_i(nT)$ under the control of the control circuitry 53. The control circuitry 53 includes timing circuitry which is programmed to condition the FIFO 55 to output the appropriate signal samples in accordance with respective interpolating functions. In addition it includes counting circuitry that is reset to zero by each horizontal synchronizing pulse Hs, and which counts pulses of the sampling clock Fs. Respective count values are an indication of the current location along a horizontal scan line. The count values are applied as address codes to a coefficient memory 54. The coefficient memory is programmed with scaling coefficients used to program the interpolating filter and thereby condition it to exhibit a particular function $h_i(nT)$. Thus the interpolating filter 56 is reprogrammed every sample interval (though it may be programmed to perform the same function for a number of successive sample intervals, particularly in the center of a line). Each function $h_i(nT)$ is defined by a set of coefficients $h_{i1}, h_{i2}, \ldots h_{in}$ stored in the memory 54. A set of coefficients is provided for each address value.

Desirably the DAC 57 should have a flat frequency response over the range of frequencies exhibited by the digital signal to be converted. In this arrangement however it is known a priori that the particular DAC used in the apparatus will distort the signal during digital to analog conversion. That is, the DAC has an impulse response $g(nT)$ different from unity. The impulse response $g(nT)$ is a consequence of at least the $\sin(\pi fT)/\pi fT$ output characteristic of the DAC, and may include other contributions. To compensate the non ideal frequency characteristics of the DAC 55, the design of the interpolating filter 56 is modified. Let $H_i(\omega)$ represent the Fourier transform of the nominal impulse response $h_i(nT)$ of the interpolating filter 56, and let $G(\omega)$ represent the Fourier transform of the impulse response $g(nT)$. The respective impulse responses $h_i'(nT)$ of the modified interpolating filter correspond to the inverse Fourier transform, $IF(.)$, of the ratio of $H_i(\omega)$ and $G(\omega)$, or;

$$h'(nT) = IF(H_i(\omega)/G(\omega));$$

or $$h_i'(nT) = h_i(nT) * g^{-1}(nT)$$

where the asterisk designates convolution, and $g^{-1}(nT)$ is a time response function which has an amplitude and phase response that is the reciprocal of $g(nT)$.

Thus to compensate for the undesirable roll-off of the DAC, the programming coefficients stored in the coefficient memory 54 correspond to the coefficients that define the respective impulse responses $h_i'(nT)$ rather than $h_i(nT)$. Note that no extra hardware is required to perform the compensation.

Figure 2:
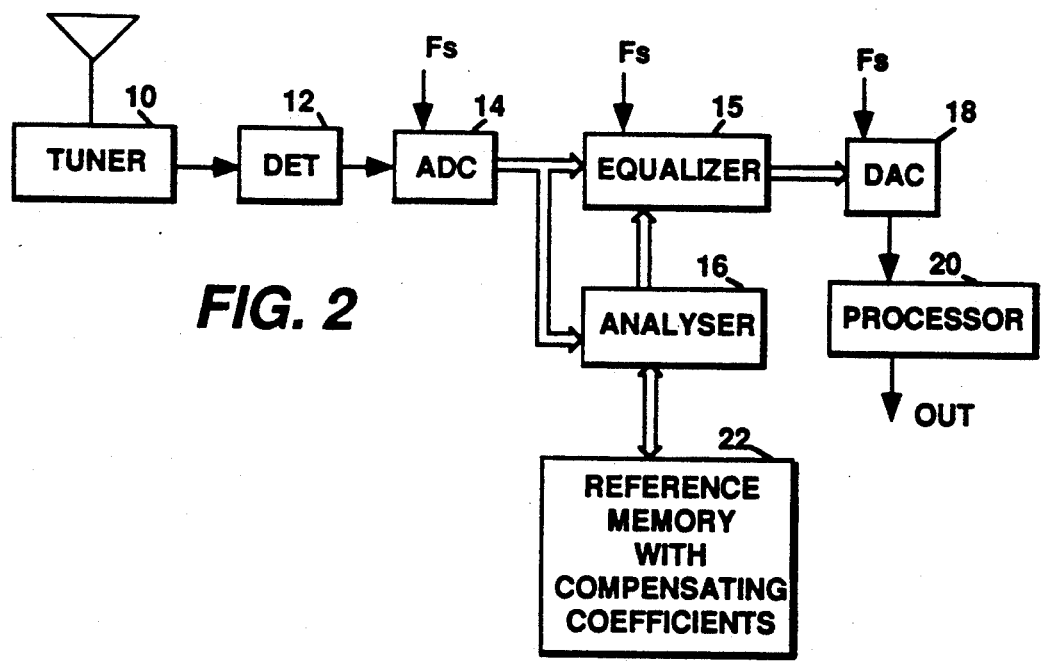
FIG. 2 is a block diagram of a video signal deghosting apparatus incorporating the invention.

FIG. 2 illustrates a further embodiment in the environment of a television signal deghosting apparatus. In certain geographical areas broadcast television signals will reflect off solid objects, and then recombine with the direct signal. The result on demodulation and display of the received signal is the occurrence of phantom-like replicas of the transmitted image appearing spatially displaced from the desired or direct image. These images may be removed by incorporating deghosting apparatus.

In FIG. 2, transmitted television signals are received by antenna and applied to a tuner and IF circuit 10. Signal from the circuitry 10 is applied to a detector 12 which develops a analog baseband composite television signal. The composite signal is coupled to an analog-to-digital convertor 14, which develops digital representations of the analog composite signal. The digital composite signal is applied to deghosting apparatus including an equalizing filter 15, an analyzer 16 and a source of reference values 22. Deghosted signal output from the equalizing filter is applied to the digital-to-analog convertor 18 which restores the signal to analog form. The deghosted analog composite signal is then applied to processing circuitry 20, which may be a conventional television receiver, or rebroadcasting apparatus etc.

Deghosting apparatus fall into the class of circuitry known as equalizing filters. In a typical equalizing or deghosting implementation, a model of the signal transmission channel is determined. An equalizing filter is then configured to render the transmission channel transparent to the transmitted signal. A detailed explanation of ghost cancelling, using frequency transform techniques, may be found in the U.S. Pat. No. 4,897,725 by T. Tanaka etal, entitled "Ghost Cancelling Circuit".

Assume that the broadcast signal contains regularly recurring training signals which are precisely defined by an impulse response characteristic $v(nT)$, (having a corresponding frequency transform $V(\omega)$). The received training signal has an impulse characteristic $x(nT)$, which is equal to the convolution of the function $v(nT)$ with the impulse response characteristic of the transmission channel. Upon reception of a repetition of the training signal, the analyzer 16 isolates and stores it for computations. The computations include generating a frequency transform, $X(\omega)$ of the received training signal. The transform, $V(\omega)$, of an uncorrupted training signal is accessed from memory, and divided by the transform, $X(\omega)$. An inverse transform is performed on the quotient to produce the function $h(nT)$ which defines the required impulse response of an equalizing filter to compensate for distortions (or ghosts) introduced into the signal by the transmission channel. The analyzer is conditioned to program the equalizing filter to exhibit the impulse response $h(nT)$.

In the FIG. 2 example, assume that the DAC 18 exhibits an impulse response $g(nT)$ corresponding to $\sin(\pi fT)/\pi fT$ (with a corresponding frequency transform $G(\omega)$). The equalizing or deghosting filter 15 can be programmed to correct for both the signal distortions incurred in transmission channel and the signal distortion to be incurred by the DAC. This may be accomplished by incorporating the transform $G(\omega)$ in the computation of the impulse response $h'(nT)$ for the equalizing filter 15. There are at least two approaches to these computations. $G(\omega)$. One is to multiply the transform $X(\omega)$ by $G(\omega)$, and then dividing the transform $V(\omega)$ by the resulting product. The inverse transform $h'(nT)$, of the quotient is the desired composite impulse response for the equalizing filter 15. A second approach, which requires less computation by the analyzer 16 is to incorporate the transform $G(\omega)$ within the transform of the undistorted training signal. That is to utilize a training signal transform $V'(\omega)$ given by the equation;

$$V'(\omega) = V(\omega)/G(\omega).$$

The function $h'(nT)$ is then generated from the inverse transform of the quotient $V'(\omega)/X(\omega)$.

In the foregoing examples, the impulse response for the programming equalizing filter was calculated in the frequency domain using frequency transforms, for example FAST Fourier transforms. It will be appreciated by those skilled in the art of adaptive equalizing (or deghosting) filter design, that the impulse response $h(nT)$ may be generated in the time domain using convolution of the appropriate functions including the impulse response of the received training signal, the impulse of the undistorted training signal and the impulse response of the DAC. A detailed explanation of these techniques may be found in U.S. Pat. No. 4,864,403 entitled "Adaptive Television Ghost Cancellation System Including Filter Circuitry With Non-Integer Sample Delay."

Figure 3:
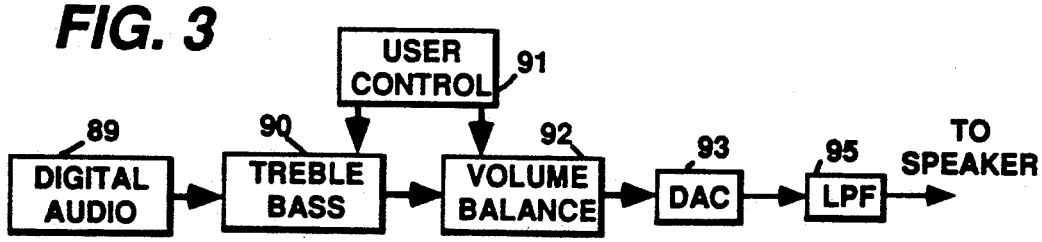
FIG. 3 is a block diagram of a portion of a digital audio signal processing system embodying the invention.

FIG. 3 illustrates a third embodiment in the context of an audio signal processing system. In the figure a portion of one channel of a digital stereo audio processor is shown. Similar circuitry would be implemented for the other stereo channel. Element 89 is a source for providing, for example, the left channel digital stereo signal, and may include tuning, demodulating and signal matrixing circuitry. The signal is coupled to the cascade connection of a volume and balance circuit 92, a treble and bass circuit 90, a DAC 93 and an analog low pass filter 95. The volume and balance circuit, and the treble and bass circuit, are both controlled via user inputs applied through a user control interface 91. Assume in this example that the DAC 93 imparts a sin $(\pi fT)/\pi fT$ frequency response characteristic to the signal converted. Also assume that the low pass filter should have a frequency response $B(\omega)=L(\omega)M(\omega)$, but in fact is limited to the frequency response $L(\omega)$.

Typically digital treble and bass circuitry are implemented with programmable filters including delay elements for concurrently providing a plurality of relatively delayed samples, scaling circuits for weighting the plurality of relatively delayed samples by selectable weighting factors and summing means for combining the weighted samples to produce the output signal. Each set of weighting coefficients, corresponding to respective bass or treble response characteristics, defines an impulse response $h_i(nT)$. Respective sets of coefficients are stored in the user interface 91. Responsive to user stimuli a set of coefficients is selected by the user according to his listening preference, and applied to program the treble and bass circuit 90.

As in the previous examples, the undesirable frequency response of the DAC 93 may be compensated in the circuitry preceding the DAC, i.e., in the programmable filter function of the treble and bass circuit. In addition the deficiency of the lowpass filter 95 may also be compensated in the treble and bass circuit. This is accomplished by altering the coefficients stored in the user interface for programming the treble and bass circuit. The stored coefficients will define impulse responses $h'_i(nT)$. rather than $h_i(nT)$. where $$h'_i(nT) = h_i(nT) * m(nT) * g^{-1}(nT)$$

m(nT) is the impulse response corresponding to the deficiency $M(\omega)$ in the desired frequency response of the low pass filter 95, $g^{-1}(nT)$ is the reciprocal time response of the undesired impulse response of the DAC 93, and the asterisk connotes the convolution function.

What is claimed is:

1. Signal processing apparatus of the type including a cascade connection of a digital filter and a digital to analog convertor, and wherein said digital filter is incorporated to perform a filter function defined by the impulse response function h(nT), said apparatus improved by conditioning said filter to exhibit an impulse response function h'(nT) given by $$h'(nT) = h(nT) * g(nT)$$

where g(nT) corresponds to the reciprocal of the time response of undesirable frequency characteristics $G(\omega)$ of said digital to analog convertor, the asterisk designates convolution, n is an index integer and T defines the period between samples applied to said digital to analog convertor.

2. Signal processing apparatus of the type including a cascade connection of a digital filter and a digital to analog convertor, and wherein said digital filter is incorporated to perform a filter function defined by the frequency response $H(\omega)$, said apparatus improved by conditioning said filter to exhibit a frequency response $H'(\omega)$ given by $$H'(\omega) = H(\omega)/G(\omega)$$

where $G(\omega)$ corresponds to undesirable frequency response characteristics of said digital to analog convertor and $\omega$ represents frequency in radians.

3. The apparatus set forth in claim 2 wherein said filter is an equalizing filter having weighting means for receiving a set of weighting coefficients h(nT) corresponding to a desired frequency response $H(\omega)$ of said equalizing filter, and said apparatus includes further apparatus for adaptively programming said equalizing filter, comprising:

a source of reference values $V(\omega)$ corresponding to frequency transform coefficients of a predetermined reference signal;

means for receiving a transmitted signal corresponding to said predetermined reference signal, and generating coefficients $X(\omega)$ corresponding to frequency transform coefficients of the received signal;

a source of frequency transform coefficients $G(\omega)$ corresponding to said undesirable frequency characteristics of said digital to analog convertor;

means for calculating frequency transform coefficients $H(\omega)$ according to the formula $$H(\omega) = V(\omega)/X(\omega)G(\omega))$$

and performing the inverse frequency transform of the frequency transform coefficients $H(\omega)$ for providing coefficients h(nT); and means for applying said coefficients h(nT) to said weighting means of said equalizing filter.

4. The apparatus set forth in claim 3 wherein said coefficients $G(\omega)$ represent the frequency response characteristic sin $(\pi fT)/\pi fT$.

5. The apparatus set forth in claim 2 wherein said filter is an equalizing filter having weighting means for receiving a set of weighting coefficients h(nT) corresponding to a desired frequency response $H(\omega)$ of said equalizing filter, and said apparatus includes further apparatus for adaptively programming said equalizing filter, comprising:

a source of reference values $V'(\omega)$ corresponding to frequency transform coefficients defined by the equation $$V'(\omega) = V(\omega)/G(\omega)$$

where $V(\omega)$ corresponds to frequency transform coefficients of a predetermined reference signal and $G(\omega)$ corresponds to frequency transform coefficients representing the frequency response of the digital to analog converter;

means for receiving a transmitted signal corresponding to said predetermined reference signal, and generating coefficients $X(\omega)$ corresponding to frequency transform coefficients of the received signal;

means for calculating frequency transform coefficients $H(\omega)$ according to the equation $$H(\omega) = V'(\omega)/X(\omega)$$

and performing the inverse frequency transform of the frequency transform coefficients H(ω) for providing coefficients h(nT); and means for applying said coefficients h(nT) to said weighting means of said equalizing filter.

6. The apparatus set forth in claim 5 wherein said coefficients G(ω) represent the frequency response characteristic sin (πfT)/πfT.

7. The apparatus set forth in claim 2 wherein said filter is a programmable interpolating filter including means for weighting a plurality of successive signal samples by a like plurality of respective weighting factors and forming respective sums of said pluralities of delayed and weighted signal samples; further including means for providing sets of weighting factors to said means for weighting, each set defining a function H'$_i$(ω); and means for successively selecting ones of said sets of weighting factors; and, wherein each function H'$_i$(ω) is determined according to the relation;

$$H'_i(\omega)=H_i(\omega)/G(\omega)$$

where H$_i$(ω) is one of a plurality of desired interpolation functions and G(ω) is an undesired frequency characteristic of said digital to analog convertor.

8. The apparatus set forth in claim 7 wherein G(ω) represents the frequency response characteristic sin(πfT)/πfT.

9. The apparatus set forth in claim 2 wherein said filter is an equalizing filter having weighting means for receiving a set of weighting coefficients h(nT) corresponding to a desired frequency response H(ω) of said equalizing filter, and said apparatus includes further apparatus for adaptively programming said equalizing filter, comprising:

a source of reference values v(nT) corresponding to successive samples of a predetermined reference signal;

means for receiving a transmitted signal corresponding to said predetermined reference signal, and represented by successive sample values x(nT);

a source of values g(nT) corresponding to the impulse response characteristics of said digital to analog convertor;

means for calculating weighting coefficients h(nT) according to the formula $$h(nT)=v(nT)*x^{-1}(nT)*g^{-1}(nT)$$

where the asterisk connotes the convolution function, and $g^{-1}(nT)$ and $x^{-1}(nT)$ are functions having amplitude and phase responses that are the reciprocals of g(nT) and x(nT) respectively; and means for applying said coefficients h(nT) to said weighting means of said equalizing filter.

10. The apparatus set forth in claim 9 wherein the values g(nT) represent the frequency response characteristic sin (πfT)/πfT.

* * * * *